(12) United States Patent
Jin

(10) Patent No.: US 7,279,955 B2
(45) Date of Patent: Oct. 9, 2007

(54) REFERENCE VOLTAGE GENERATING CIRCUIT

(75) Inventor: Seung Eon Jin, Seoul (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 149 days.

(21) Appl. No.: 11/275,460

(22) Filed: Jan. 6, 2006

(65) Prior Publication Data
US 2007/0001750 A1   Jan. 4, 2007

(30) Foreign Application Priority Data
Jun. 29, 2005   (KR) ...................... 10-2005-0057355

(51) Int. Cl.
*G05F 1/10*   (2006.01)
(52) U.S. Cl. ...................... 327/534; 327/407
(58) Field of Classification Search ................ 327/407, 327/408, 409, 410, 411, 412, 413, 530, 534, 327/535, 537, 538, 541
See application file for complete search history.

(56) References Cited

U.S. PATENT DOCUMENTS 6,040,718 A * 3/2000 Henry .......................... 327/71
6,226,213 B1   5/2001 Chih
6,952,376 B2  10/2005 Somasekhar et al.

FOREIGN PATENT DOCUMENTS

KR   1998-32054    7/1998
KR   1999-0081305 11/1999

* cited by examiner

*Primary Examiner*—Jeffrey Zweizig
(74) *Attorney, Agent, or Firm*—Marshall Gerstein & Borun LLP

(57) ABSTRACT

A reference voltage generating circuit for outputting a reference voltage having a level varying depending on the operation mode of a semiconductor device is disclosed. The reference voltage generating circuit includes a first reference voltage generator that outputs first and second initial reference voltages having different levels, a second reference voltage generator that outputs a third initial reference voltage in response to a first control signal enabled for a first predetermined time when the semiconductor device exits a first operation mode and enters a second operation mode, a multiplexer (MUX) that outputs the second initial reference voltage as a preliminary reference voltage during the first operation mode, outputs, as the preliminary reference voltage, a voltage driven by both the first initial reference voltage and the third initial reference voltage for the first predetermined time when the semiconductor device exits the first operation mode and enters the second operation mode, and outputs the first initial reference voltage as the preliminary reference voltage after the first predetermined time elapses after the semiconductor device enters the second operation mode, and a buffer that buffers the preliminary reference voltage output from the MUX, and outputs the buffered voltage as a reference voltage.

51 Claims, 5 Drawing Sheets

REFERENCE VOLTAGE GENERATING CIRCUIT

FIELD OF THE INVENTION

This patent relates to a reference voltage generating circuit, and, more particularly, to a reference voltage generating circuit which is used in a semiconductor device configured to supply an internal voltage reduced in level in a predetermined operation mode, in particular, a self refresh mode, as compared to an active mode, for a reduction in current consumption in the self refresh mode, and is adapted to rapidly return the level of a reference voltage, used as a reference to the level of the internal voltage to be generated after completion of the self refresh mode, to a normal level to enable operation of the semiconductor device in the active mode, and thus, to enable the semiconductor device to rapidly perform normal operations.

DESCRIPTION OF THE RELATED ART

Generally, semiconductor devices, in particular, dynamic random access memory (DRAM) devices, include an internal voltage generating circuit for generating an internal voltage. Such an internal voltage generating circuit includes an internal voltage generator and a reference voltage generating circuit. Generation of an internal voltage in the internal voltage generating circuit is achieved by the internal voltage generator which generates the internal voltage based on the reference voltage output from the reference voltage generating circuit. That is, in the semiconductor device, the level of the internal voltage is determined based on the level of the reference voltage output from the reference voltage generating circuit.

Meanwhile, in some semiconductor devices, the level of the internal voltage varies depending on the operating mode, in order to achieve a reduction in current consumption. In a typical example of such a semiconductor devices, the internal voltage has a reduced level in the self refresh mode, as compared to the active mode, for a reduction in current consumption in the self refresh mode. In this case, accordingly, the reference voltage output from the reference voltage generating circuit has a reduced level in the self refresh mode, in order to enable the internal voltage generator to output an internal voltage having a reduced level. After completion of the self refresh mode, the level of the reference voltage is increased to a level established prior to the self refresh mode, so as to recover the level of the internal voltage output from the internal voltage generator to the previous level.

FIG. 1 illustrates a configuration of an internal voltage generating circuit including a conventional reference voltage generating circuit. FIG. 2 illustrates a configuration of a buffer for buffering a preliminary reference voltage in the conventional reference voltage generating circuit. Problems incurred in the conventional reference voltage generating circuit will be described with reference to FIGS. 1 and 2.

As shown in FIG. 1, the conventional reference voltage generating circuit includes a reference voltage generator 110 which outputs initial reference voltages VREF1 and VREF2 having different levels, a multiplexer (MUX) 120 which outputs a preliminary reference voltage VREF having a level varying depending on whether or not the semiconductor device operates in a self refresh mode, and a unit gain buffer 130 which buffers the preliminary reference voltage VREF, thereby outputting a reference voltage VREFC to an internal voltage generator 140.

Operation of the conventional reference voltage generating circuit having the above-mentioned configuration will be described.

First, the reference voltage generator 110 outputs two initial reference voltages, namely, a first initial reference voltage VREF1 and a second initial reference voltage VREF2, to the MUX 120. In order to achieve a reduction in current consumption in the self refresh mode, the MUX 120 outputs, during the self refresh mode, the second initial reference voltage VREF2 which has a level lower than that of the first initial reference voltage VREF1 in an active mode. That is, in response to the control signal SREFV, the MUX 110 supplies the first initial reference voltage VREF1 as the preliminary reference voltage VREF in a period before the semiconductor device enters the self refresh mode, and supplies the second initial reference voltage VREF2 as the preliminary reference voltage VREF in a period after the semiconductor device enters the self refresh mode. In a period after the semiconductor device exits the self refresh mode, the MUX 110 re-supplies the first initial reference voltage VREF1 as the preliminary reference voltage VREF.

The unit gain buffer 130 receives the preliminary reference voltage VREF from the MUX 110, and buffers the preliminary reference voltage VREF, to output a reference voltage VREFC. The unit gain buffer 130 is used to output the reference voltage VREFC which has the same level as the preliminary reference voltage VREF while being enhanced in drive power. In detail, in the circuit of FIG. 2, when the reference voltage VREFC is lower than the preliminary reference voltage VREF under the condition in which an n-channel metal oxide semiconductor (NMOS) transistor N13 is turned on in accordance with reception of a voltage VBIAS, a node A is pulled down because an NMOS transistor N11 is turned on. Accordingly, a p-channel MOS (PMOS) transistor P12 is turned on, so that a node B is pulled up to be increased in potential. On the other hand, when the reference voltage VREFC is higher than the preliminary reference voltage VREF, an NMOS transistor N12 is turned on, so that the potential of the node B is lowered. Thus, the unit gain buffer 130 performs a buffer function by repeating the above operations to output the reference voltage VREFC maintained at the same level as the preliminary reference voltage VREF while being increased in drive power.

However, the conventional reference voltage generating circuit has a problem in that excessive time is taken to recover the reference voltage VREFC to a previous level when the semiconductor device exits the self refresh mode and enters the active mode, thereby preventing the semiconductor device from operating normally. That is, although the conventional reference voltage generating circuit recovers the level of the preliminary reference voltage VREF output from the MUX 120 from the level of the voltage VREF2 to the level of the voltage VREF1 when the semiconductor device exits the self refresh mode and enters the active mode, the level recovery cannot be rapidly achieved because the drive power of the reference voltage generating circuit is weak. Furthermore, the level change of the reference voltage by the buffering of the preliminary reference voltage cannot be rapidly achieved due to delayed operations of the unit gain buffer. Such delayed level recovery of the reference voltage results in a considerably prolonged period of time taken to recover the level of the internal voltage to an original level. As a result, there is a problem in that the semiconductor may malfunction.

SUMMARY OF THE INVENTION

A reference voltage generating circuit is used in a semiconductor device configured to supply an internal voltage reduced in level in a predetermined operation mode, in particular, a self refresh mode, as compared to an active mode, for a reduction in current consumption in the self refresh mode, and is adapted to rapidly return the level of a reference voltage, used as a reference to the level of the internal voltage to be generated after completion of the self refresh mode, to a normal level to enable operation of the semiconductor device in the active mode, and thus, to enable the semiconductor device to rapidly perform normal operations.

A reference voltage generating circuit may output a reference voltage having a level varying depending on the operation mode of a semiconductor device, and may include a first reference voltage generator which outputs first and second initial reference voltages having different levels; a second reference voltage generator which outputs a third initial reference voltage in response to a first control signal enabled for a first predetermined time when the semiconductor device exits a first operation mode and enters a second operation mode; a multiplexer (MUX) which outputs the second initial reference voltage as a preliminary reference voltage during the first operation mode, outputs, as the preliminary reference voltage, a voltage driven by both the first initial reference voltage and the third initial reference voltage for the first predetermined time when the semiconductor device exits the first operation mode and enters the second operation mode, and outputs the first initial reference voltage as the preliminary reference voltage after the first predetermined time elapses after the semiconductor device enters the second operation mode; and a buffer which buffers the preliminary reference voltage output from the MUX, and outputs the buffered voltage as a reference voltage.

The buffer may comprise a unit gain buffer which buffers the preliminary reference voltage by a unit gain, and outputs the buffered voltage as the reference voltage, and a differential buffer which is enabled for the first predetermined time when the semiconductor device exits the first operation mode and enters the second operation mode, to differentially amplify the preliminary reference voltage and to output the differently amplified voltage as the reference voltage.

The differential buffer may comprise a first current mirror type amplifier which compares the reference voltage with the preliminary reference voltage, and amplifies the resultant differential voltage, a first pull-up unit which increases the level of the reference voltage to a level of the preliminary reference voltage when the level of the reference voltage is lower than the level of the preliminary reference voltage, and a first switching unit which switches the first current mirror type amplifier on/off in response to the first control signal enabled for the first predetermined time when the semiconductor device exits the first operation mode and enters the second operation mode.

The first switching unit may be arranged between the first current mirror type amplifier and a ground terminal.

The first current mirror type amplifier may comprise a first pull-down unit which is arranged between the first switching unit and a first node, and is turned on in response to the preliminary reference voltage, a second pull-down unit which is arranged between the first switching unit and a second node, and is turned on in response to the reference voltage, a second pull-up unit which is arranged between the first node and an external voltage terminal, and is turned on in response to a voltage at the second node, and a third pull-up unit which is arranged between the second node and the external voltage terminal, and is turned on in response to the voltage at the second node.

The first pull-up unit may be a p-channel metal oxide semiconductor (PMOS) transistor which is turned on in response to a signal from the first node.

The unit gain buffer may comprise a second switching unit which is arranged between the ground terminal and a third node, a third pull-down unit which is arranged between the second switching unit and a fourth node, and is turned on in response to the preliminary reference voltage, a fourth pull-down unit which is arranged between the second switching unit and a fifth node, and is turned on in response to the reference voltage, a fourth pull-up unit which is arranged between the fourth node and the external voltage terminal, and is turned on in response to a voltage at the fourth node, and a fifth pull-up unit which is arranged between the fifth node and the external voltage terminal, and is turned on in response to the voltage at the fourth node.

The MUX may comprise a first switch which outputs the third initial reference voltage in response to the first control signal.

The MUX may further comprise a second switch which outputs the second initial reference voltage in response to a second control signal enabled during the first operation mode and disabled when the semiconductor device enters the second operation mode, and a third switch which outputs the first initial reference voltage in response to an inverted signal of the second control signal.

The second control signal is a self refresh signal which is enabled during a self refresh mode, and disabled when the semiconductor device enters an active mode.

The first reference voltage generator may comprise a first current mirror type amplifier which compares a first voltage signal with a second voltage signal, and amplifies the resultant differential signal, a sixth pull-up unit which increases the level of the first voltage signal to the level of the second voltage signal when the level of the first voltage signal is lower than the level of the second voltage signal, and a first voltage divider which divides the first voltage signal to output the first and second initial reference voltages.

The second reference voltage generator may comprise a second current mirror type amplifier which compares a third voltage signal with a fourth voltage signal, and amplifies the resultant differential signal, a seventh pull-up unit which increases a level of the third voltage signal to the level of the fourth voltage signal when the level of the third voltage signal is lower than the level of the fourth voltage signal, and a third switching unit which switches the second current mirror type amplifier on/off in response to the first control signal enabled for a first predetermined time after the semiconductor device exits the first operation mode and enters the second operation mode.

The second reference voltage generator may further comprise a second voltage divider which divides the third voltage signal to output the third initial reference voltage.

The third switching unit may be arranged between the second current mirror type amplifier and the ground terminal.

The second current mirror type amplifier may comprise a fifth pull-down unit which is arranged between the third switching unit and a sixth node, and is turned on in response to the fourth voltage signal, a sixth pull-down unit which is arranged between the third switching unit and a seventh node, and is turned on in response to the third voltage signal, an eighth pull-up unit which is arranged between the sixth node and the external voltage terminal, and is turned on in response to a voltage at the seventh node, and a ninth pull-up unit which is arranged between the seventh node and the external voltage terminal, and is turned on in response to the voltage at the seventh node.

The seventh pull-up unit may be a p-channel metal oxide semiconductor (PMOS) transistor which is turned on in response to a signal from the first node.

The first initial reference voltage may be higher than the second initial reference voltage.

The third initial reference voltage may be equal to the first initial reference voltage.

The first operation mode may be a self refresh mode.

The second operation mode may be an active mode.

The reference voltage generating circuit may further comprise a signal output unit which outputs the first control signal in response to a second control signal enabled during the first operation mode and disabled when the first operation mode is completed.

The signal output unit may comprise a delay which delays the second control signal for a predetermined time, and outputs the delayed signal, a buffer which buffers the signal output from the delay, and a logic unit which logically operates the second control signal and a signal output from the buffer.

The buffer may be an inverter which performs an inverse buffering operation.

The logic unit may be a NOR gate which performs a NORing operation.

BRIEF DESCRIPTION OF THE DRAWINGS

Features and advantages of the present invention will become more apparent after reading the following detailed description when taken in conjunction with the drawings, in which.

DESCRIPTION OF THE PREFERRED EMBODIMENTS

Hereinafter, the present invention will be described in detail, in conjunction with exemplary embodiments. These embodiments are used only for illustrative purposes, and the present invention is not limited thereto.

Although the following description is given mainly in conjunction with a semiconductor device in which an internal voltage having a relatively low level is supplied during a self refresh mode, the present invention can be applied not only to such a semiconductor device, but also to other semiconductor devices in which internal voltages of different levels are supplied in different operation modes, respectively, in order to achieve a reduction in current consumption.

Figure 1:
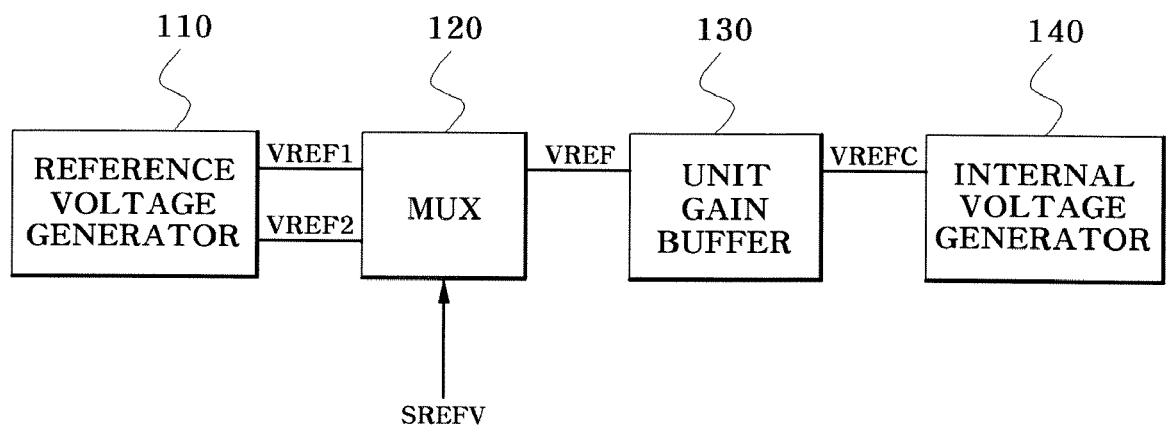
FIG. 1 is a block diagram illustrating a configuration of an internal voltage generating circuit including a conventional reference voltage generating circuit.
Figure 2:
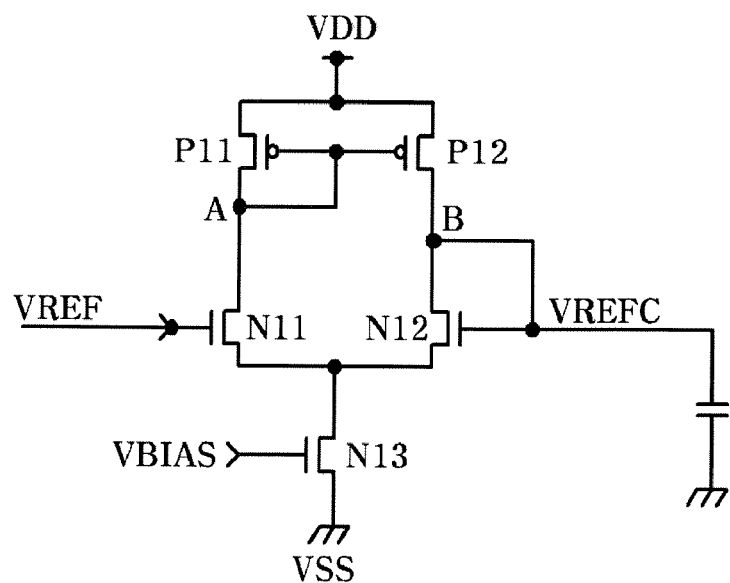
FIG. 2 is a circuit diagram illustrating a configuration of a buffer for buffering a preliminary reference voltage in the conventional reference voltage generating circuit.
Figure 3:
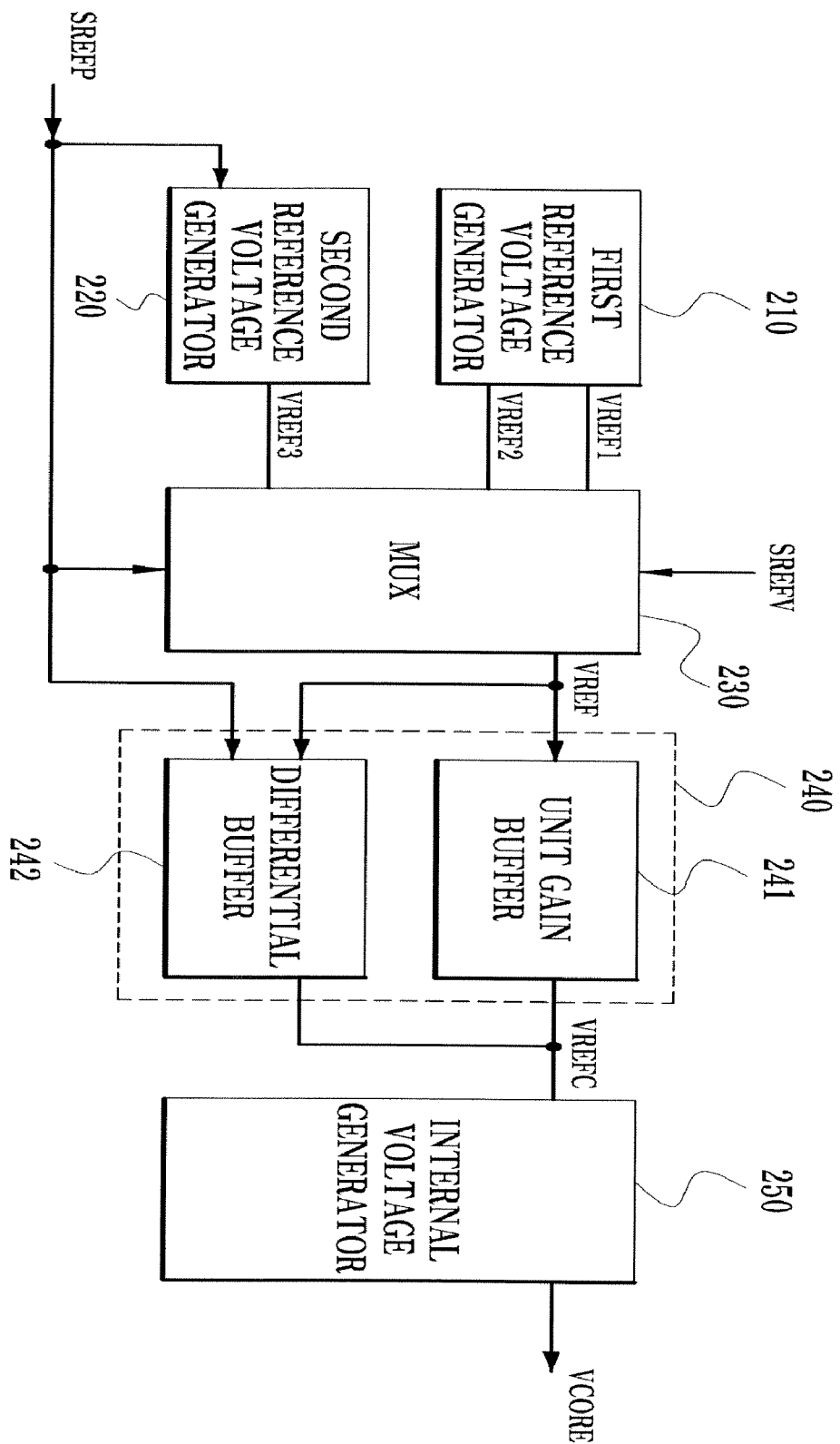
FIG. 3 is a block diagram illustrating a configuration of a reference voltage generating circuit according to an embodiment of the present invention, and a configuration of an internal voltage generating circuit using the reference voltage generating circuit.

FIG. 3 illustrates a configuration of a reference voltage generating circuit according to an embodiment of the present invention, and a configuration of an internal voltage generating circuit using the reference voltage generating circuit. FIGS. 4 to 8 illustrate configurations of a first reference voltage generator, a second reference voltage generator, a multiplexer (MUX), a buffer, and a signal output unit which are included in the reference voltage generating circuit according to the illustrated embodiment of the present invention. The present invention will be described with reference to these drawings.

The reference voltage generating circuit according to the illustrated embodiment of the present invention is designed to output a reference voltage having a level varying depending on the operation mode of the semiconductor device. As shown in FIG. 3, the reference voltage generating circuit includes a first reference voltage generator 210 which outputs first and second initial reference voltages VREF1 and VREF 2 having different levels, and a second reference voltage generator 220 which outputs a third initial reference voltage VREF3 in response to a control signal SREFP enabled for a first time when the semiconductor device exits a self refresh mode and enters an active mode. The reference voltage generating circuit also includes a MUX 230 which outputs the second initial reference voltage VREF2 as a preliminary reference voltage VREF during the self refresh mode, outputs, as the preliminary reference voltage VREF, a voltage driven by both the first initial reference voltage VREF1 and the third initial reference voltage VREF3 for the first time when the semiconductor device exits the self refresh mode and enters the active mode, and outputs the first initial reference voltage VREF1 as the preliminary reference voltage VREF after the first time elapses after the semiconductor device enters the active mode. The reference voltage generating circuit further includes a buffer 240 which buffers the preliminary reference voltage VREF output from the MUX 230, and outputs the buffered voltage as a reference voltage VREFC.

The buffer 240 includes a unit gain buffer 241 which buffers the preliminary reference voltage VREF by a unit gain, and outputs the buffered voltage as the reference voltage VREFC, and a differential buffer 242 which is enabled for the first time when the semiconductor device exits the self refresh mode and enters the active mode, to differentially amplify the preliminary reference voltage VREF and to output the differentially amplified voltage as the reference voltage VREFC.

Figure 7:
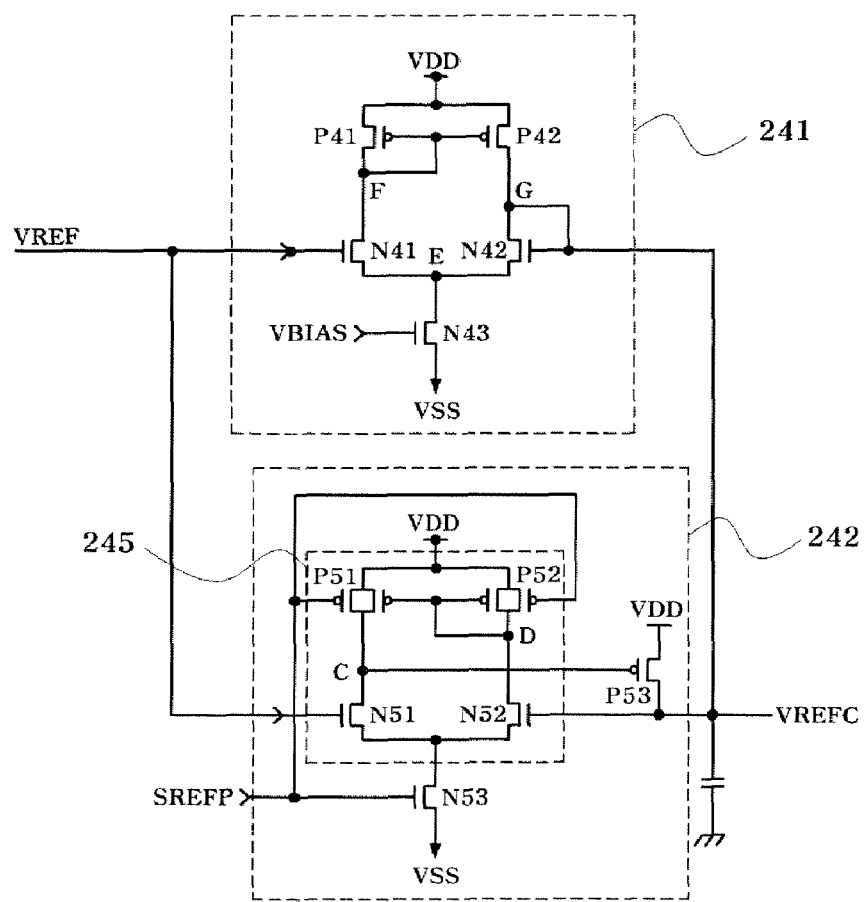
FIG. 7 is a circuit diagram illustrating a configuration of a buffer included in the reference voltage generating circuit according to the illustrated embodiment of the present invention.

As shown in FIG. 7, the differential buffer 242 includes a first current mirror type amplifier 245 which compares the reference voltage VREFC with the preliminary reference voltage VREF, and amplifies the resultant differential voltage, a PMOS transistor P53 which increases the level of the reference voltage VREFC to the level of the preliminary reference voltage VREF when the level of the reference voltage VREFC is lower than the level of the preliminary reference voltage VREF, and an NMOS transistor N53 which switches the first current mirror type amplifier 245 on/off in response to the control signal SREFP enabled for the first time when the semiconductor device exits the self refresh mode and enters the active mode. The first current mirror type amplifier 245 includes an NMOS transistor N51 which is arranged between the NMOS transistor N53 and a node C, and is turned on in response to the preliminary reference voltage VREF, an NMOS transistor N 52 which is arranged between the NMOS transistor N53 and a node D, and is turned on in response to the reference voltage VREFC, a PMOS transistor P51 which is arranged between the node C and an external voltage terminal VDD, and is turned on in response to a voltage at the node D, and a PMOS transistor P52 which is arranged between the node D and the external voltage terminal VDD, and is turned on in response to the voltage at the node D.

As shown in FIG. 7, the unit gain buffer 241 includes an NMOS transistor N43 which is arranged between a ground terminal VSS and a node E, an NMOS transistor N41 which is arranged between the NMOS transistor N43 and a node F, and is turned on in response to the preliminary reference voltage VREF, an NMOS transistor N42 which is arranged between the NMOS transistor N43 and a node G, and is turned on in response to the reference voltage VREFC, a PMOS transistor P41 which is arranged between the node F and the external voltage terminal VDD, and is turned on in response to a voltage at the node F, and a PMOS transistor P42 which is arranged between the node G and the external voltage terminal VDD, and is turned on in response to the voltage at the node F.

Figure 6:
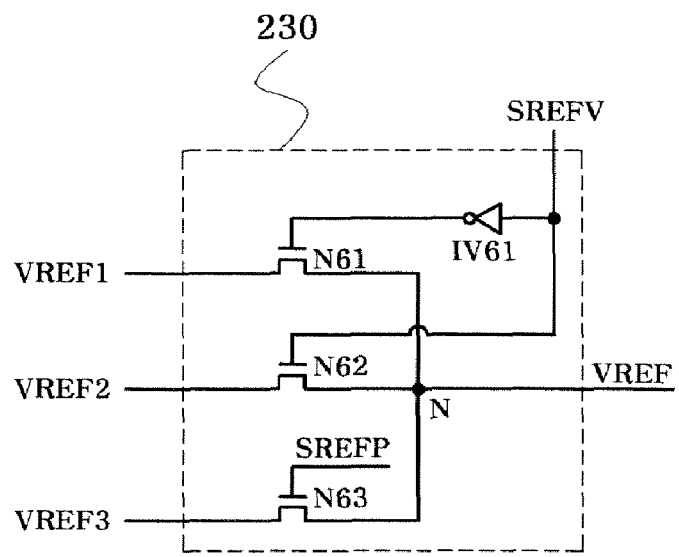
FIG. 6 is a circuit diagram illustrating a configuration of a multiplexer (MUX) included in the reference voltage generating circuit according to the illustrated embodiment of the present invention.

As shown in FIG. 6, the MUX 230 includes an NMOS transistor N61 which outputs the first initial reference voltage VREF1 in response to an inverted signal of the control signal SREFV enabled during the self refresh mode and disabled when the semiconductor device enters the active mode, an NMOS transistor N62 which outputs the second initial reference voltage VREF2 in response to the control signal SREFV, and an NMOS transistor N63 which outputs the third initial reference voltage VREF3 in response to the control signal SREFP.

Figure 4:
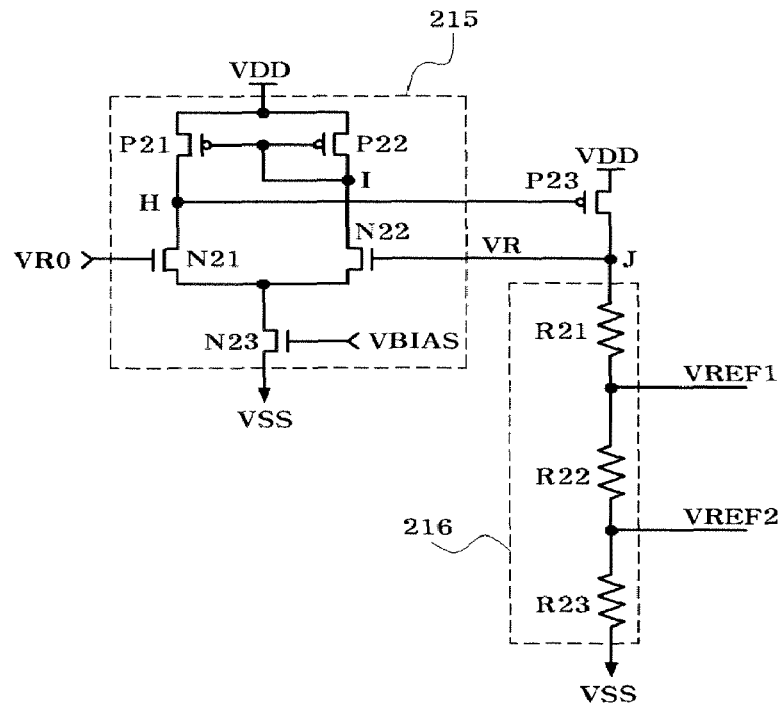
FIG. 4 is a circuit diagram illustrating a configuration of a first reference voltage generator included in the reference voltage generating circuit according to the illustrated embodiment of the present invention.

As shown in FIG. 4, the first reference voltage generator 210 includes a second current mirror type amplifier 215 which compares a voltage signal VR with a voltage signal VR0, and amplifies the resultant differential signal, a PMOS transistor P23 which increases the level of the voltage signal VR to the level of the voltage signal VR0 when the level of the voltage signal VR is lower than the level of the voltage signal VR0, and a first voltage divider 216 which divides the voltage signal VR to output the first and second initial reference voltages VREF1 and VREF2.

Figure 5:
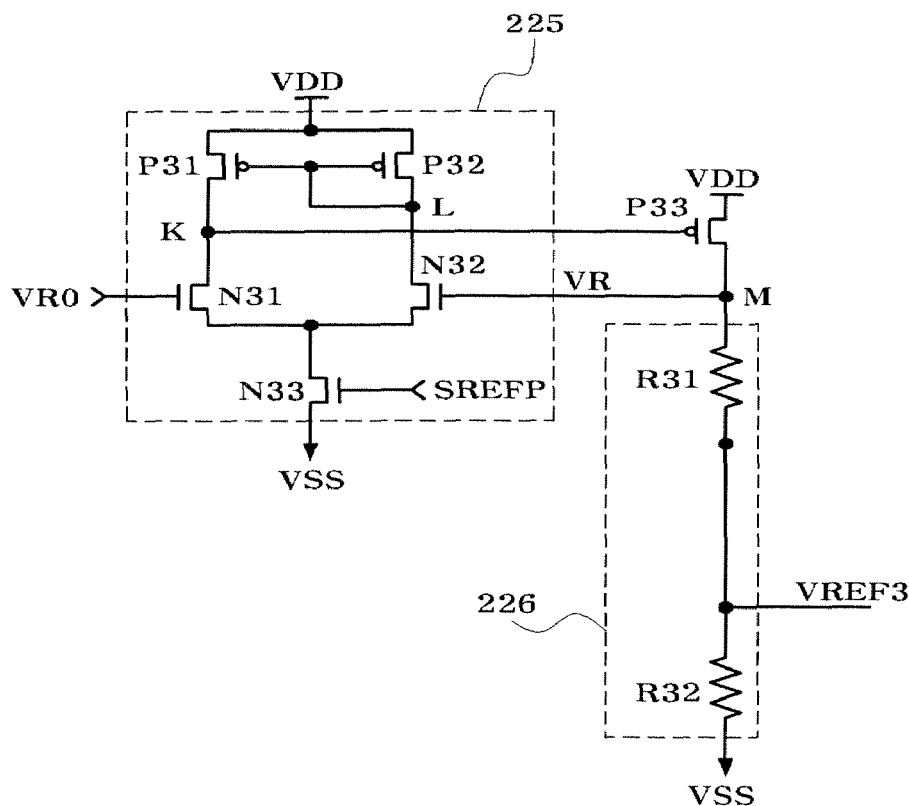
FIG. 5 is a circuit diagram illustrating a configuration of a second reference voltage generator included in the reference voltage generating circuit according to the illustrated embodiment of the present invention.

As shown in FIG. 5, the second reference voltage generator 220 includes a third current mirror type amplifier 225 which compares the voltage signal VR with the voltage signal VR0, and amplifies the resultant differential signal, a PMOS transistor P33 which increases the level of the voltage signal VR to the level of the voltage signal VR0 when the level of the voltage signal VR is lower than the level of the voltage signal VR0, and an NMOS transistor N33 which switches the third current mirror type amplifier 225 on/off in response to the control signal SREFP enabled for the first time when the semiconductor device exits the self refresh mode and enters the active mode. The second reference voltage generator 220 further includes a second voltage divider 226 which divides the voltage signal VR to output the third initial reference voltage VREF3.

In the illustrated embodiment, the first initial reference voltage VREF1 is higher than the second initial reference voltage VREF2, and the third reference voltage VREF3 is equal to the first initial reference voltage VREF1.

Figure 8:
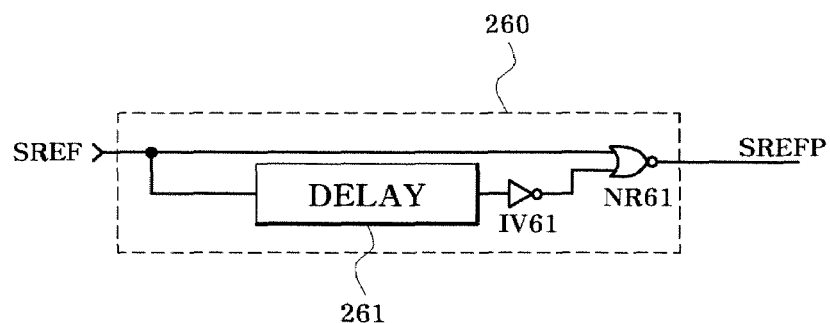
FIG. 8 is a circuit diagram illustrating a configuration of a signal output unit included in the reference voltage generating circuit according to the illustrated embodiment of the present invention.

As shown in FIG. 8, the reference voltage generating circuit according to the illustrated embodiment further includes a signal output unit 261 which outputs a control signal SREFP in response to the control signal SREF enabled during the self refresh mode and disabled when the self refresh mode is completed. The signal output unit 260 includes a delay 261 which outputs the control signal SREF after delaying the control signal SREF for a predetermined time, an inverter IV61 which inversely buffers the output signal from the delay 261, and a NOR gate which NORs the control signal SREF and the output signal from the inverter IV61.

Operation of the reference voltage generating circuit having the above-described configuration according to the illustrated embodiment will be described with reference to FIGS. 3 to 9. The following description will be given in association with operations in a period X before the semiconductor device enters the self refresh mode, a self refresh mode period Y, and a period Z after the semiconductor device exits the self refresh mode, respectively.

First, operation of the reference voltage generating circuit in the period X before the semiconductor device enters the self refresh mode will be described. In the period X, the control signal SREFV is in a low level state. Accordingly, the MUX 230 outputs a preliminary reference voltage VREF which has a relatively high level, namely, the level of the first initial reference voltage VREF1. This operation will be described in detail. The control signal SREFV is transited to a high level, namely, an enabled state, when the semiconductor device enters the self refresh mode, and is transited to a low level, namely, a disabled state, when the semiconductor device exits the self refresh mode.

As shown in FIG. 4, the second current mirror type amplifier 215 and PMOS transistor P23 compare the voltage signal VR with the voltage signal VR0, and amplify the resultant differential signal. This will be described in detail. If the voltage VR is lower than the voltage VR0 under the condition in which the NMOS transistor N23 is turned on in accordance with application of a voltage VBIAS thereto, the NMOS transistor N21 is turned on, thereby causing the node H to be pulled down. Accordingly, the PMOS transistor P23 is turned on, thereby causing the node J to be pulled up, and thus, to be increased in potential. On the other hand, if the voltage VR is higher than the voltage VR0, the NMOS transistor N22 is turned on, thereby causing the node I to be pulled down. Accordingly, the PMOS transistor P21, which receives a low-level signal from the node I at a gate thereof, is turned on, thereby causing the node H to be pulled up to a high level. As a result, the PMOS transistor P23 is turned off, so that the potential at the node J is lowered. The second current mirror type amplifier 215 and PMOS transistor P23 maintain the voltage signal VR at a desired level by repeating the above operations, and supply the voltage signal VR to the first voltage divider 216.

The first voltage divider 216 divides the voltage signal VR into two voltage levels, namely, the first and second initial reference voltages VREF1 and VREF2, using resistors R21, R22, and R23. In accordance with the voltage division, the first initial reference voltage VREF1 has a level higher than that of the second initial reference voltage VREF2.

Meanwhile, the second reference voltage generator 220 is in an OFF state in accordance with application of a control signal SREFP having a low level thereto. That is, the control signal SREF is in a low-level state, namely, a disabled state, in the period X before the semiconductor device enters the self refresh mode. In this state, accordingly, a low-level signal and a high-level signal are input to the NOR gate NR61 of the signal output unit 260 shown in FIG. 8, so that the control signal SREFP has a low level. As a result, the second reference voltage generator 220 shown in FIG. 5 is turned off as the low-level control signal SREFP is applied to the NMOS transistor N33. Here, the control signal SREF is a signal which is transited to a high-level state, namely, an enabled state, when the semiconductor device enters the self refresh mode, and is transited to a low-level state, namely, a disabled state, when the semiconductor device exits the self refresh mode.

Figure 9:
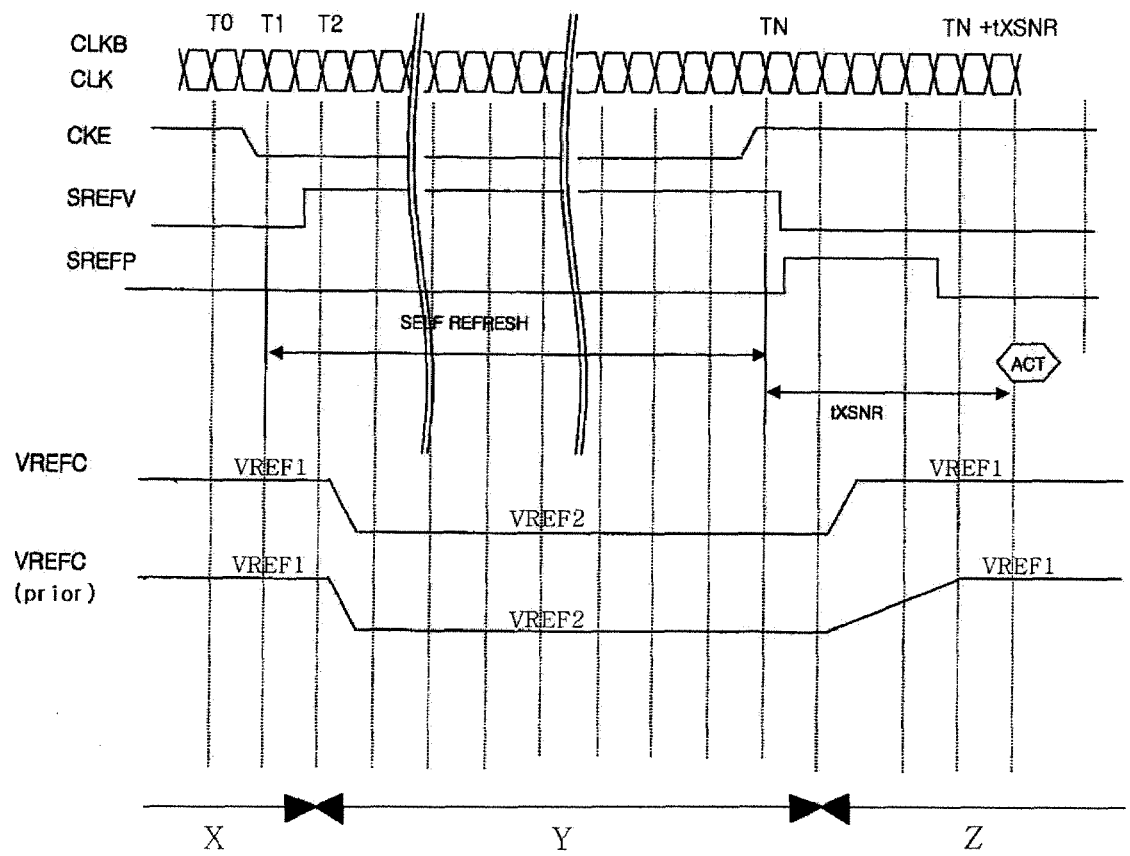
FIG. 9 is a timing diagram explaining operation of the reference voltage generating circuit according to the illustrated embodiment of the present invention.

Subsequently, the MUX 230 shown in FIG. 6 selectively outputs the first initial reference voltage VREF1 or the second initial reference voltage VREF2 in accordance with the operation mode of the semiconductor device. That is, the control signal SREFV is maintained in a low-level state, namely, a disable state, until the semiconductor device enters the self refresh mode. In response to the low-level control signal SREFV, the NMOS transistor N61 is turned on, so that the first initial reference voltage VREF1 having a relatively high level is outputted as the preliminary reference voltage VREF, as shown in FIG. 9. In this state, the NMOS transistor N63 is in an OFF state in accordance with application of the low-level control signal SREFP thereto.

Thereafter, the buffer 240 buffers the preliminary reference voltage VREF having the level of the first initial reference voltage VREF1, and outputs the buffered voltage as the reference voltage VREFC. This will be described in detail. First, the unit gain buffer 241 receives and buffers the preliminary reference voltage VREF, and outputs the buffered voltage as the reference voltage VREFC, as shown in FIG. 7. Here, the unit gain buffer 241 buffers the reference voltage VREFC having the level of the first initial reference voltage VREF1 such that the reference voltage VREFC has an increased drive power. In detail, in the circuit of FIG. 7, when the reference voltage VREFC is lower than the preliminary reference voltage VREF under the condition in which the NMOS transistor N43 is turned on in accordance with application of the voltage VBIAS thereto, the node F is pulled down because the NMOS transistor N41 is turned on. Accordingly, the PMOS transistor P42 is turned on, so that the node G is pulled up to be increased in potential. On the other hand, when the reference voltage VREFC is higher than the preliminary reference voltage VREF, the NMOS transistor N42 is turned on, so that the potential of the node G is lowered. Thus, the unit gain buffer 241 performs a buffer function by repeating the above operations to output the reference voltage VREFC maintained at the same level as the preliminary reference voltage VREF while being increased in drive power.

Meanwhile, the differential buffer 242 is in an OFF state in accordance with application of the low-level control signal SREFP. That is, the NMOS transistor N53 is turned off in accordance with application of the low-level control signal SREFP, so that the differential buffer 242 is turned off.

Thus, the reference voltage generating circuit according to the illustrated embodiment outputs, to the internal voltage generator 250, the reference voltage VREFC having a relatively high level corresponding to the level of the first initial reference voltage VREF1, before the semiconductor device enters the self refresh mode.

Next, operation of the reference voltage generating circuit in the period Y, for which the semiconductor device is in the self refresh mode, will be described. In the period Y, both the control signal SREF and the control signal SREFV are in a high level state. Accordingly, the MUX 230 outputs a preliminary reference voltage VREF which has a relatively low level, namely, the level of the second initial reference voltage VREF2. This operation will be described in detail.

As described above, in the circuit of FIG. 4, the second current mirror type amplifier 215 and PMOS transistor P23 compare the voltage signal VR with the voltage signal VR0, and amplify the resultant differential signal. The first voltage divider 216 divides the voltage signal VR into two voltage levels, namely, the first and second initial reference voltages VREF1 and VREF2, using resistors R21, R22, and R23.

Meanwhile, the second reference voltage generator 220 is still in an OFF state in accordance with application of the low-level control signal SREFP thereto. That is, the control signal SREF, which is in a high-level state, namely, an enabled state, in the period Y, is input to the NOR gate NR61 of the signal output unit 260 shown in FIG. 8, so that the control signal SREFP still has a low level. As a result, the second reference voltage generator 220 is turned off as the low-level control signal SREFP is applied to the NMOS transistor N33.

Subsequently, the MUX 230 shown in FIG. 6 outputs the second initial reference voltage VREF2 as the preliminary reference voltage VREF in the self refresh mode period Y. That is, when the semiconductor device enters the self refresh mode, the control signal SREFV is transited to a high-level state, namely, an enable state. In response to the high-level control signal SREFV, the NMOS transistor N62 is turned on, and the NMOS transistor N61 is turned off, so that the second initial reference voltage VREF2 having a relatively low level is outputted as the preliminary reference voltage VREF. In this state, the NMOS transistor N63 is still in an OFF state in accordance with application of the low-level control signal SREFP thereto.

Thereafter, the buffer 240 buffers the preliminary reference voltage VREF having the level of the second initial reference voltage VREF2, and outputs the buffered voltage as the reference voltage VREFC. This will be described in detail. First, the unit gain buffer 241 buffers the preliminary reference voltage VREF in accordance with the same operation principle as described in conjunction with the period X, to output the reference voltage VREFC having the level of the second initial reference voltage VREF2 while having enhanced drive power. In this state, the differential buffer 242 is in an OFF state in accordance with application of the low-level control signal SREFP. That is, in the circuit of FIG. 7, the NMOS transistor N53 is turned off in accordance with application of the low-level control signal SREFP, so that the differential buffer 242 is turned off.

Thus, the reference voltage generating circuit according to the illustrated embodiment outputs, to the internal voltage generator 250, the reference voltage VREFC having a relatively low level corresponding to the level of the second initial reference voltage VREF2, in the self refresh mode period Y.

Next, operation of the reference voltage generating circuit in the period Z after the semiconductor device exits the self refresh mode will be described. When the period Z is begun, both the control signal SREF and the control signal SREFV are transited to a low level. Accordingly, the MUX 230 outputs a preliminary reference voltage VREF which has a relatively high level, namely, the level of the first initial reference voltage VREF1. This operation will be described in detail.

As described above, in the circuit of FIG. 4, the second current mirror type amplifier 215 and PMOS transistor P23 compare the voltage signal VR with the voltage signal VR0, and amplify the resultant differential signal. The first voltage divider 216 divides the voltage signal VR into two voltage levels, namely, the first and second initial reference voltages VREF1 and VREF2, using resistors R21, R22, and R23.

Meanwhile, the second reference voltage generator 220 is turned on in accordance with reception of the control signal SREFP maintained in a high level state for a predetermined time. That is, the control signal SREF is transited from a high level to a low level, namely, a disabled state, in the period Z after completion of the self refresh mode. The low-level control signal SREF is input to one input terminal of the NOR gate NR61 of the signal output unit 260 shown in FIG. 8. Meanwhile, the output signal from the delay 261 is applied to the other input terminal of the NOR gate NR61 after being inverted by the inverter IV61. The output signal of the delay 261 has a level corresponding to the previous level of the control signal SREF, namely, a high level, until the delay time caused by the delay 261 elapses. Accordingly, the signals input to the two input terminals of the NOR gate NR61 have a low level until the delay time elapses, so that the control signal SREFP output from the NOR gate NR61 has a high level. After the delay time elapses, the output signal from the inverter IV61 is transited to a high level. In this state, accordingly, the control signal SREFP output from the NOR gate NR61 is transited to a low level. Thus, when the semiconductor device exits the self refresh mode, the control signal SREFP output from the signal output unit 260 is transited to a high level, namely, an enabled state. The control signal SREFP is maintained in the enable state until the delay time elapses, and is subsequently transited to a low level, namely, a disabled state.

Meanwhile, the second reference voltage generator 220 is in an ON state in the period for which the control signal SREFP is maintained in the high-level state, namely, the enabled state, so that the second reference voltage generator 220 outputs the third initial reference voltage VREF3. This will be described in detail.

As shown in FIG. 5, the third current mirror type amplifier 225 and PMOS transistor P33 compare the voltage signal VR with the voltage signal VR0, and amplify the resultant differential signal. This will be described in detail. If the voltage VR is lower than the voltage VR0 under the condition in which the NMOS transistor N33 is turned on in accordance with application of the high-level control signal SREFP thereto, the NMOS transistor N31 is turned on, thereby causing the node K to be pulled down. Accordingly, the PMOS transistor P33 is turned on, thereby causing the node M to be pulled up, and thus, to be increased in potential. On the other hand, if the voltage VR is higher than the voltage VR0, the NMOS transistor N32 is turned on, thereby causing the node L to be pulled down. Accordingly, the PMOS transistor P31, which receives a low-level signal from the node L at a gate thereof, is turned on, thereby causing the node K to be pulled up to a high level. As a result, the PMOS transistor P33 is turned off, so that the potential at the node M is lowered. The second current mirror type amplifier 225 and PMOS transistor P33 maintain the voltage signal VR at a desired level by repeating the above operations, and supply the voltage signal VR to the second voltage divider 226.

The second voltage divider 226 divides the voltage signal VR using resistors R31 and R32, to output the third initial reference voltage VREF3. In the illustrated embodiment, the resistance values of the resistors R31 and R32 are appropriately adjusted such that the third initial reference voltage VREF3 has the same level as that of the first initial reference voltage VREF1.

Subsequently, the MUX 230 shown in FIG. 6 outputs, as the preliminary reference voltage VREF, a voltage driven by both the first initial reference voltage VREF1 and the third initial reference voltage VREF3. That is, the control signal SREFV is transited to a low-level state, namely, a disabled state, when the semiconductor device exits the self refresh mode. In response to the low-level control signal SREFV, the NMOS transistor N61 is turned on, so that the first initial reference voltage VREF1 having a relatively high level is output to the node N as the preliminary reference voltage VREF, as shown in FIG. 9. Meanwhile, the control signal SREFP is maintained in a high-level state, namely, an enable state, for the delay time. In response to the high-level control signal SREFP, the NMOS transistor N63 is turned on, thereby causing the third initial reference voltage VREF3 to be output to the node N. Thus, the node N is driven not only by the first initial reference voltage VREF1 output from the first reference voltage generator 210, but also by the third initial reference voltage VREF3 output from the second reference voltage generator 220, so that the preliminary reference voltage VREF output from the MUX 230 for the delay time after completion of the self refresh mode is supplied in a state of having enhanced drive power. In accordance with the illustrated embodiment, therefore, the preliminary reference voltage VREF is rapidly transited from the level of the second initial reference voltage VREF2 to the first initial reference voltage VREF1, and the reference voltage VREFC, which is influenced by the preliminary reference voltage VREF, is also rapidly transited from the level of the second initial reference voltage VREF2 to the first initial reference voltage VREF1.

Thereafter, the buffer 240 buffers the preliminary reference voltage VREF, and outputs the buffered voltage as the reference voltage VREFC. This will be described in detail. First, the unit gain buffer 241 buffers the preliminary reference voltage VREF in accordance with the same operation principle as described in conjunction with the period X, to output the reference voltage VREFC having the level of the first initial reference voltage VREF1 while having enhanced drive power.

In this state, the differential buffer 242 is turned on in accordance with application of the high-level control signal SREFP, thereby outputting the reference voltage VREFC. This operation will be described in detail. If the reference voltage VREFC is lower than the preliminary reference voltage VREF under the condition that the NMOS transistor N53 is turned on in accordance with application of the high-level control signal SREFP thereto, the NMOS transistor N51 is turned on, thereby causing the node C to be pulled down. Accordingly, the PMOS transistor P53 is turned on, so that the terminal outputting the reference voltage VREFC is pulled up, and thus, to be increased in potential. On the other hand, if the reference voltage VREFC is higher than the preliminary reference voltage VREF, the NMOS transistor N52 is turned on, thereby causing the node D to be pulled down. Accordingly, the PMOS transistor P51, which receives a low-level signal from the node D at a gate thereof, is turned on, thereby causing the node C to be pulled up to a high level. As a result, the PMOS transistor P53 is turned off, so that the potential at the terminal outputting the reference voltage VREFC is lowered. The first current mirror type amplifier 245 and PMOS transistor P53 output the reference voltage VREFC which has a desired level, by repeating the above operations.

Thus, in the delay time after completion of the self refresh mode, both the unit gain buffer 241 and the differential buffer 242 output the reference voltage VREFC which has the level of the first initial reference voltage VREF1. In the illustrated embodiment, therefore, the buffering and driving power of the unit gain buffer 241 can be reinforced by the differential buffer 242, so that the level increase of the reference voltage VREFC can be rapidly achieved, as shown in FIG. 9. Accordingly, it is possible to prevent a delayed level increase of the reference voltage caused by delayed operation of the unit gain buffer, as incurred in conventional cases, and thus, to achieve rapid level transition of the internal voltage in the semiconductor device.

When the delay time elapses after completion of the self refresh mode, the control signal SREFP is transited to a low level, namely, a disabled state, thereby causing the second reference voltage generator 220 and differential buffer 242 to be turned off. Accordingly, the reference voltage generating circuit according to the illustrated embodiment outputs the reference voltage VREFC having the level of the first initial reference voltage VREF1 in accordance with the same operation as that of the period X before the self refresh mode.

As described above, the reference voltage generating circuit according to the present invention additionally includes a separate reference voltage generator adapted for generation of a preliminary reference voltage, in order to achieve an enhancement in drive power, and thus, to rapidly transit the level of the preliminary voltage from the level of the second initial reference voltage VREF2 to the level of the first initial reference voltage VREF1. The reference voltage generating circuit also includes a differential buffer which buffers the preliminary reference voltage, and outputs the buffered voltage as a reference voltage, in order to achieve an enhancement in the drive power to increase the level of the reference voltage. Thus, the level of the reference voltage for generation of an internal voltage is rapidly returned to a normal level for operations in an active mode, after completion of a self refresh mode.

The above-described reference voltage generating circuit according to the present invention is applicable to semiconductor devices which are designed to supply an internal voltage reduced in level in a particular operation mode, as compared to modes other than the particular operation mode, for a reduction in current consumption in the particular operation mode.

As apparent from the above description, the present invention provides a reference voltage generating circuit which is used in a semiconductor device configured to supply an internal voltage reduced in level in a predetermined operation mode, in particular, a self refresh mode, as compared to an active mode, for a reduction in current consumption in the self refresh mode, and which additionally includes a separate reference voltage generator adapted for generation of a preliminary reference voltage, and a differential buffer for buffering the preliminary reference voltage, and outputting the buffered voltage as a reference voltage, in order to rapidly return the level of a reference voltage, used as a reference to the level of the internal voltage to be generated after completion of the self refresh mode, to a normal level to enable operation of the semiconductor device in the active mode, and thus, to enable the semiconductor device to rapidly perform normal operations.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A reference voltage generating circuit for outputting a reference voltage having a level varying depending on the operation mode of a semiconductor device, comprising:
   a first reference voltage generator that outputs first and second initial reference voltages having different levels;
   a second reference voltage generator that outputs a third initial reference voltage in response to a first control signal enabled for a first predetermined time when the semiconductor device exits a first operation mode and enters a second operation mode;
   multiplexer (MUX) that outputs the second initial reference voltage as a preliminary reference voltage during the first operation mode, and outputs, as the preliminary reference voltage, a voltage driven by both the first initial reference voltage and the third initial reference voltage for the first predetermined time when the semiconductor device exits the first operation mode and enters the second operation mode; and
   a buffer that buffers the preliminary reference voltage output from the MUX, and outputs the buffered voltage as a reference voltage.

2. The reference voltage generating circuit according to claim 1, wherein the MUX outputs the first initial reference voltage as the preliminary reference voltage after the first predetermined time elapses after the semiconductor device enters the second operation mode.

3. The reference voltage generating circuit according to claim 1, wherein the buffer comprises:
   a unit gain buffer which buffers the preliminary reference voltage by a unit gain, and outputs the buffered voltage as the reference voltage; and
   a differential buffer which is enabled for the first predetermined time when the semiconductor device exits the first operation mode and enters the second operation mode, to differentially amplify the preliminary reference voltage and to output the differentially amplified voltage as the reference voltage.

4. The reference voltage generating circuit according to claim 3, wherein the differential buffer comprises:
   a first current mirror type amplifier that compares the reference voltage with the preliminary reference voltage, and amplifies the resultant differential voltage;
   a first pull-up unit that increases the level of the reference voltage to a level of the preliminary reference voltage when the level of the reference voltage is lower than the level of the preliminary reference voltage; and
   a first switching unit that switches the first current mirror type amplifier on/off in response to the first control signal enabled for the first predetermined time when the semiconductor device exits the first operation mode and enters the second operation mode.

5. The reference voltage generating circuit according to claim 4, wherein the first switching unit is arranged between the first current mirror type amplifier and a ground terminal.

6. The reference voltage generating circuit according to claim 4, wherein the first current mirror type amplifier comprises:
a first pull-down unit that is arranged between the first switching unit and a first node, and is turned on in response to the preliminary reference voltage;
a second pull-down unit that is arranged between the first switching unit and a second node, and is turned on in response to the reference voltage;
a second pull-up unit that is arranged between the first node and an external voltage terminal, and is turned on in response to a voltage at the second node; and
a third pull-up unit that is arranged between the second node and the external voltage terminal, and is turned on in response to the voltage at the second node.

7. The reference voltage generating circuit according to claim 6, wherein the first pull-up unit is a p-channel metal oxide semiconductor (PMOS) transistor that is turned on in response to a signal from the first node.

8. The reference voltage generating circuit according to claim 3, wherein the unit gain buffer comprises:
a first switching unit that is arranged between a ground terminal and a first node;
a first pull-down unit that is arranged between the first switching unit and a second node, and is turned on in response to the preliminary reference voltage;
a second pull-down unit that is arranged between the first switching unit and a third node, and is turned on in response to the reference voltage;
a first pull-up unit that is arranged between the second node and an external voltage terminal, and is turned on in response to a voltage at the second node; and
a second pull-up unit that is arranged between the third node and the external voltage terminal, and is turned on in response to the voltage at the second node.

9. The reference voltage generating circuit according to claim 8, wherein the MUX comprises:
a first switch which outputs the third initial reference voltage in response to the first control signal.

10. The reference voltage generating circuit according to claim 9, wherein the MUX further comprises:
a second switch that outputs the second initial reference voltage in response to a second control signal enabled during the first operation mode and disabled when the semiconductor device enters the second operation mode; and
a third switch that outputs the first initial reference voltage in response to an inverted signal of the second control signal.

11. The reference voltage generating circuit according to claim 10, wherein the second control signal is a self refresh signal that is enabled during a self refresh mode, and disabled when the semiconductor device enters an active mode.

12. The reference voltage generating circuit according to claim 11, wherein the first reference voltage generator comprises:
a current mirror type amplifier that compares a first voltage signal with a second voltage signal, and amplifies the resultant differential signal;
a pull-up unit that increases the level of the first voltage signal to a level of the second voltage signal when the level of the first voltage signal is lower than the level of the second voltage signal; and
a voltage divider that divides the first voltage signal to output the first and second initial reference voltages.

13. The reference voltage generating circuit according to claim 12, wherein the second reference voltage generator comprises:
a current mirror type amplifier that compares a first voltage signal with a second voltage signal, and amplifies the resultant differential signal;
a first pull-up unit that increases a level of the first voltage signal to a level of the second voltage signal when the level of the first voltage signal is lower than the level of the second voltage signal; and
a switching unit that switches the current mirror type amplifier on/off in response to the first control signal enabled for the first predetermined time after the semiconductor device exits the first operation mode and enters the second operation mode.

14. The reference voltage generating circuit according to claim 13, wherein the second reference voltage generator further comprises:
a voltage divider that divides the first voltage signal to output the third initial reference voltage.

15. The reference voltage generating circuit according to claim 13, wherein the switching unit is arranged between the current mirror type amplifier and a ground terminal.

16. The reference voltage generating circuit according to claim 13, wherein the current mirror type amplifier comprises:
a first pull-down unit that is arranged between the switching unit and a first node, and is turned on in response to the second voltage signal;
a second pull-down unit that is arranged between the switching unit and a second node, and is turned on in response to the first voltage signal;
a second pull-up unit that is arranged between the first node and an external voltage terminal, and is turned on in response to a voltage at the second node; and
a third pull-up unit that is arranged between the second node and the external voltage terminal, and is turned on in response to the voltage at the second node.

17. The reference voltage generating circuit according to claim 16, wherein the first pull-up unit is a p-channel metal oxide semiconductor (PMOS) transistor that is turned on in response to a signal from the first node.

18. The reference voltage generating circuit according to claim 17, wherein the first initial reference voltage is higher than the second initial reference voltage.

19. The reference voltage generating circuit according to claim 17, wherein the third initial reference voltage is equal to the first initial reference voltage.

20. The reference voltage generating circuit according to claim 17, wherein the first operation mode is a self refresh mode.

21. The reference voltage generating circuit according to claim 20, wherein the second operation mode is an active mode.

22. The reference voltage generating circuit according to claim 8, further comprising:
a signal output unit which outputs the first control signal in response to a second control signal enabled during the first operation mode and disabled when the first operation mode is completed.

23. The reference voltage generating circuit according to claim 22, wherein the signal output unit comprises:
a delay that delays the second control signal for a predetermined time, and outputs the delayed signal;
a buffer that buffers the signal output from the delay; and
a logic unit that logically operates the second control signal and a signal output from the buffer.

24. The reference voltage generating circuit according to claim 23, wherein the buffer is an inverter that performs an inverse buffering operation.

25. The reference voltage generating circuit according to claim 23, wherein the logic unit is a NOR gate that performs a NORing operation.

26. A reference voltage generating circuit for outputting a reference voltage having a level varying depending on the operation mode of a semiconductor device, comprising:
- a first reference voltage generator that outputs first and second initial reference voltages having different levels;
- a second reference voltage generator that outputs a third initial reference voltage in response to a self-refresh signal; and
- a multiplexer (MUX) inputting the first and the second and the third initial reference voltages and outputting the first and the third voltages in response to the self-refresh signal.

27. The reference voltage generating circuit according to claim 26, further comprising a buffer that buffers the preliminary reference voltage output from the MUX, and outputs the buffered voltage as a reference voltage.

28. The reference voltage generating circuit according to claim 26, wherein the MUX outputs the first initial reference voltage as the preliminary reference voltage after the first predetermined time elapses after the semiconductor device enters the second operation mode.

29. The reference voltage generating circuit according to claim 26, wherein the buffer comprises:
- a unit gain buffer that buffers the preliminary reference voltage by a unit gain, and outputs the buffered voltage as the reference voltage; and
- a differential buffer that is enabled for the first predetermined time when the semiconductor device exits the first operation mode and enters the second operation mode, to differentially amplify the preliminary reference voltage and to output the differentially amplified voltage as the reference voltage.

30. The reference voltage generating circuit according to claim 29, wherein the differential buffer comprises:
- a first current mirror type amplifier that compares the reference voltage with the preliminary reference voltage, and amplifies the resultant differential voltage;
- a first pull-up unit that increases the level of the reference voltage to a level of the preliminary reference voltage when the level of the reference voltage is lower than the level of the preliminary reference voltage; and
- a first switching unit that switches the first current mirror type amplifier on/off in response to the first control signal enabled for the first predetermined time when the semiconductor device exits the first operation mode and enters the second operation mode.

31. The reference voltage generating circuit according to claim 30, wherein the first switching unit is arranged between the first current mirror type amplifier and a ground terminal.

32. The reference voltage generating circuit according to claim 30, wherein the first current mirror type amplifier comprises:
- a first pull-down unit that is arranged between the first switching unit and a first node, and is turned on in response to the preliminary reference voltage;
- a second pull-down unit that is arranged between the first switching unit and a second node, and is turned on in response to the reference voltage;
- a second pull-up unit that is arranged between the first node and an external voltage terminal, and is turned on in response to a voltage at the second node; and
- a third pull-up unit that is arranged between the second node and the external voltage terminal, and is turned on in response to the voltage at the second node.

33. The reference voltage generating circuit according to claim 32, wherein the first pull-up unit is a p-channel metal oxide semiconductor (PMOS) transistor that is turned on in response to a signal from the first node.

34. The reference voltage generating circuit according to claim 29, wherein the unit gain buffer comprises:
- a first switching unit that is arranged between a ground terminal and a first node;
- a first pull-down unit that is arranged between the first switching unit and a second node, and is turned on in response to the preliminary reference voltage;
- a second pull-down unit that is arranged between the first switching unit and a third node, and is turned on in response to the reference voltage;
- a first pull-up unit that is arranged between the second node and an external voltage terminal, and is turned on in response to a voltage at the second node; and
- a second pull-up unit that is arranged between the third node and the external voltage terminal, and is turned on in response to the voltage at the second node.

35. The reference voltage generating circuit according to claim 26, wherein the MUX comprises:
- a first switch that outputs the third initial reference voltage in response to the first control signal.

36. The reference voltage generating circuit according to claim 35, wherein the MUX further comprises:
- a second switch that outputs the second initial reference voltage in response to a second control signal enabled during the first operation mode and disabled when the semiconductor device enters the second operation mode; and
- a third switch that outputs the first initial reference voltage in response to an inverted signal of the second control signal.

37. The reference voltage generating circuit according to claim 36, wherein the second control signal is a self refresh signal that is enabled during a self refresh mode, and disabled when the semiconductor device enters an active mode.

38. The reference voltage generating circuit according to claim 26, wherein the first reference voltage generator comprises:
- a current mirror type amplifier that compares a first voltage signal with a second voltage signal, and amplifies the resultant differential signal;
- a pull-up unit that increases the level of the first voltage signal to a level of the second voltage signal when the level of the first voltage signal is lower than the level of the second voltage signal; and
- a voltage divider that divides the first voltage signal to output the first and second initial reference voltages.

39. The reference voltage generating circuit according to claim 26, wherein the second reference voltage generator comprises:
- a current mirror type amplifier that compares a first voltage signal with a second voltage signal, and amplifies the resultant differential signal;
- a first pull-up unit that increases a level of the first voltage signal to a level of the second voltage signal when the level of the first voltage signal is lower than the level of the second voltage signal; and a switching unit that switches the current mirror type amplifier on/off in response to the first control signal enabled for the first predetermined time after the semiconductor device exits the first operation mode and enters the second operation mode.

40. The reference voltage generating circuit according to claim 39, wherein the second reference voltage generator further comprises:

a voltage divider that divides the first voltage signal to output the third initial reference voltage.

41. The reference voltage generating circuit according to claim 39, wherein the switching unit is arranged between the current mirror type amplifier and a ground terminal.

42. The reference voltage generating circuit according to claim 39, wherein the current mirror type amplifier comprises:

a first pull-down unit that is arranged between the switching unit and a first node, and is turned on in response to the second voltage signal;

a second pull-down unit that is arranged between the switching unit and a second node, and is turned on in response to the first voltage signal;

a second pull-up unit that is arranged between the first node and an external voltage terminal, and is turned on in response to a voltage at the second node; and a third pull-up unit that is arranged between the second node and the external voltage terminal, and is turned on in response to the voltage at the second node.

43. The reference voltage generating circuit according to claim 42, wherein the first pull-up unit is a p-channel metal oxide semiconductor (PMOS) transistor that is turned on in response to a signal from the first node.

44. The reference voltage generating circuit according to claim 26, wherein the first initial reference voltage is higher than the second initial reference voltage.

45. The reference voltage generating circuit according to claim 26, wherein the third initial reference voltage is equal to the first initial reference voltage.

46. The reference voltage generating circuit according to claim 26, wherein the first operation mode is a self refresh mode.

47. The reference voltage generating circuit according to claim 46, wherein the second operation mode is an active mode.

48. The reference voltage generating circuit according to claim 26, further comprising:

a signal output unit that outputs the first control signal in response to a second control signal enabled during the first operation mode and disabled when the first operation mode is completed.

49. The reference voltage generating circuit according to claim 48, wherein the signal output unit comprises:

a delay that delays the second control signal for a predetermined time, and outputs the delayed signal;

a buffer that buffers the signal output from the delay; and a logic unit that logically operates the second control signal and a signal output from the buffer.

50. The reference voltage generating circuit according to claim 49, wherein the buffer is an inverter that performs an inverse buffering operation.

51. The reference voltage generating circuit according to claim 49, wherein the logic unit is a NOR gate which performs a NORing operation.

* * * * *